US010690317B2

United States Patent
Smith et al.

(10) Patent No.: US 10,690,317 B2
(45) Date of Patent: Jun. 23, 2020

(54) ILLUMINATION DEVICE FOR OPTIMIZING POLARIZATION IN AN ILLUMINATION PUPIL

(71) Applicant: Nikon Corporation, Tokyo (JP)

(72) Inventors: Daniel Gene Smith, Tucson, AZ (US); Michael Sogard, Menlo Park, CA (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/666,162

(22) Filed: Aug. 1, 2017

(65) Prior Publication Data

US 2017/0328538 A1    Nov. 16, 2017

Related U.S. Application Data

(63) Continuation of application No. 13/662,140, filed on Oct. 26, 2012, now Pat. No. 9,732,934.

(60) Provisional application No. 61/628,314, filed on Oct. 28, 2011.

(51) Int. Cl.
   *F21V 7/00* (2006.01)
   *G03F 7/20* (2006.01)

(52) U.S. Cl.
   CPC ........ *F21V 7/0033* (2013.01); *G03F 7/70116* (2013.01); *G03F 7/70566* (2013.01)

(58) Field of Classification Search
   CPC . G03F 7/70116; G03F 7/70566; F21V 7/0033
   See application file for complete search history.

(56) References Cited

U.S. PATENT DOCUMENTS

| 6,913,373 | B2 | 7/2005 | Tanaka et al. |
| 2007/0146676 | A1 | 6/2007 | Tanitsu et al. |
| 2007/0188730 | A1 | 8/2007 | Takeuchi et al. |
| 2007/0296936 | A1 | 12/2007 | Kato et al. |
| 2008/0030707 | A1 | 2/2008 | Tanaka et al. |
| 2009/0109417 | A1 | 4/2009 | Tanitsu |
| 2009/0117494 | A1 | 5/2009 | Owa |
| 2009/0128886 | A1 | 5/2009 | Hirota |
| 2009/0135392 | A1 | 5/2009 | Muramatsu |
| 2010/0165318 | A1 | 7/2010 | Fiolka et al. |
| 2011/0228247 | A1* | 9/2011 | Mulder ............... G03F 7/70116 355/71 |
| 2013/0077077 | A1* | 3/2013 | Saenger ............. G03F 7/70566 355/71 |

FOREIGN PATENT DOCUMENTS

| EP | 0779530 | 6/1997 |
| WO | 2010040506 | 4/2010 |
| WO | 2010037476 | 8/2010 |
| WO | 2011147658 | 12/2011 |

* cited by examiner

*Primary Examiner* — Andrew J Coughlin
*Assistant Examiner* — Nathaniel J Lee
(74) *Attorney, Agent, or Firm* — Yakov Sidorin; Quarles & Brady LLP

(57) ABSTRACT

A new and useful illumination device, e.g. for a lithographic optical imaging system, is provided, and comprises a mirror array located between a radiation source and an illumination pupil. Each mirror element of the mirror array is individually steerable (controllable), and the polarization state of light from each mirror element of the mirror array can be selectively controlled, so that the illumination pupil can be filled with a distribution of light that is selectively controlled.

19 Claims, 6 Drawing Sheets

ILLUMINATION DEVICE FOR OPTIMIZING POLARIZATION IN AN ILLUMINATION PUPIL

CROSS-REFERENCE TO RELATED APPLICATIONS

The present application is a continuation from the U.S. patent application Ser. No. 13/662,140, filed on Oct. 26, 2012 and now published as US 2013/0148359, which in turn claims priority from U.S. Provisional Patent Application No. 61/628,314, filed on Oct. 28, 2011, and titled "Illumination Device for Optimizing Polarization in an Illumination Pipil". The disclosure of each of the above-identified applications is incorporated by reference herein.

SUMMARY

The present teaching provides an illumination device for source mask optimization of the polarization distribution in the illumination pupil of a lithographic optical imaging system.

The illumination device comprises a mirror array located between a radiation source and an illumination pupil, and each mirror element of the mirror array is individually steerable (controllable), and the polarization state of light from each mirror element, or groups of elements, of the mirror array can be selectively controlled, so that the illumination pupil can be filled with a distribution of light that is selectively controlled.

The present teaching provides an illumination device, e.g. for a lithographic optical imaging system, comprising a mirror array located between a radiation source and an illumination pupil, where each mirror element of the mirror array is individually steerable (controllable), and the polarization state of light from each mirror element of the mirror array can be selectively controlled, so that the illumination pupil can be filled with a distribution of light that is selectively controlled.

There are several ways in which the present teaching can be implemented. For example, a. A retarder coating can be applied to selected mirror elements to control the polarization state of light reflected from each mirror element of the mirror array. In addition, a wave plate can be provided before the mirror array to set the incident polarization, and thereby making the polarization switchable.

b. An additional mirror array can be provided between the mirror array and the illumination pupil, where the additional mirror array receives radiation from the mirror array and directs the radiation to the illumination pupil. Preferably, the additional mirror array is conjugate to the mirror array. Also the system can use any of the following concepts:

i. an intervening relay system located between the mirror arrays.

ii. an array of polarization filters (or retarders) can be located between the mirror arrays.

iii. a wedge of optically active material can be located between the mirror arrays, such that the orientation of linear polarization leaving the wedge depends continuously on the position of the beam in the wedge.

These and other features of the present teaching will be further apparent from the following detailed description and the accompanying drawings.

DETAILED DESCRIPTION

As described above, th108-6290e present embodiment provides an illumination device for source mask optimization of the polarization distribution in the illumination pupil of a lithographic optical imaging system, e.g. for a lithograph optical imaging system that uses ArF (Argon Fluoride), or KrF (Krypton Fluoride) radiation source.

The illumination device comprises a mirror array (e.g. a Micro-Mirror Array or MMA) located between a radiation source and an illumination pupil, and each mirror element of the mirror array is individually steerable (controllable), and the polarization state of light from each mirror element, or groups of elements, of the mirror array can be selectively controlled, so that the illumination pupil can be filled with a distribution of light that is selectively controlled.

The following description shows various ways in which the present invention can be implemented, and from that description it is believed that various other ways in which the present invention can be implemented will be apparent to those in the art.

Figure 1:
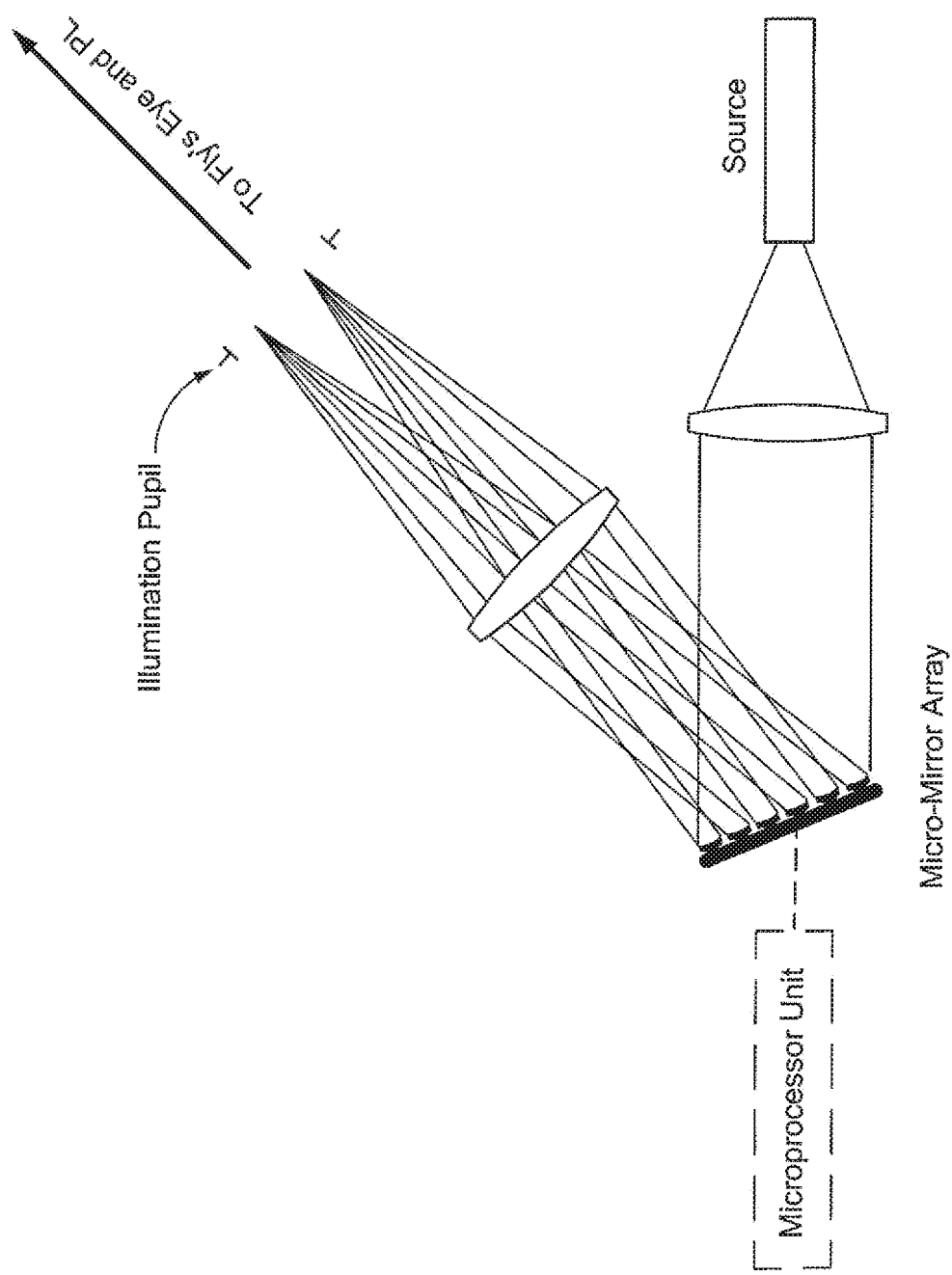
FIG. 1 is a schematic illustration of an illumination system without polarization control with a mirror array located between the source and the illumination pupil.

Initially, it is believed useful to understand the concept of how an illumination system without polarization control can be implemented with a mirror array (e.g. a Micro-Mirror Array, or MMA) located between the source and the illumination pupil. FIG. 1 schematically shows such a system. The mirror array of FIG. 1 (referred to in the figures as a Micro-Mirror Array) is a known system that is used to distribute light of a single polarization in the illumination pupil. A well-known method for generated pupil position dependent polarizations, is to place polarization filter masks roughly conjugate to the pupil. With the system of FIG. 1, each mirror element of the mirror array is individually steerable (adjustable), e.g. by a microprocessor unit, so that the illumination pupil can be filled with a controlled distribution of light (radiation). The more mirror elements in the mirror array, the more detailed control over the illumination distribution that can be exercised. In another known approach, polarization filter masks can be placed near the mirror array so that the incident radiation will have different polarizations for adjacent groups of elements, and then those elements can be steered to send their polarization to predetermined regions in the pupil.

In the present embodiment, the mirror array to be used can be, for example, those continuously changing each of orientations of the mirror elements arranged two-dimensionally. Such mirror array can be selected, for example, from the mirror arrays disclosed in U.S. Pat. Nos. 6,900,915, 7,095,546, and 7,884,920. It is also possible to control the orientations of the mirror elements arranged two-dimensionally, in a plurality of discrete steps. The teachings in U.S. Pat. Nos. 6,900,915, 7,095,546, and 7,884,920 are incorporated herein by reference.

Figure 2:
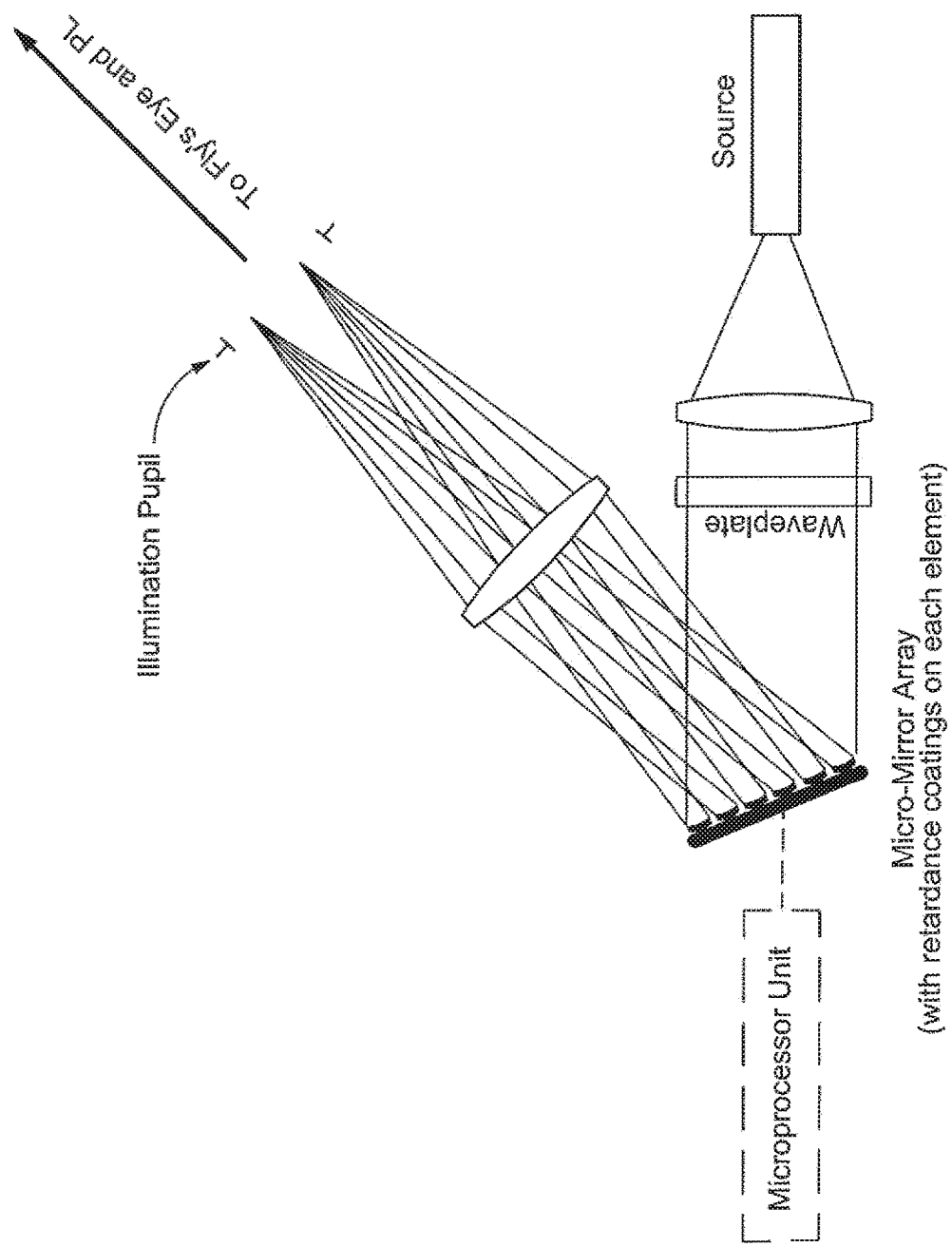
FIG. 2 is a schematic illustration of one embodiment of the present invention, in which polarization control is obtained through the retardance of thin films deposited on the individual mirror elements.

In one embodiment of this invention, polarization control is obtained through the retardance of thin films deposited on the individual mirror elements as shown in FIG. 2. The retardance of a coating generally depends on the design of the coating, which includes the choice of material refractive indices, the number and thickness of the layers. The retardance also depends on the angle of incidence and wavelength of light, but coatings can be designed that are insensitive to angle of incidence over some range of angles and wavelengths of light. The polarization of the light that reaches the illumination pupil from each mirror element then depends on the retardance of each mirror element's coating, and on the polarization of the incident light, which can be controlled by the orientation of a waveplate, for example, placed just before the mirror array as shown in FIG. 2. Other means of adjusting the incident polarization, in an embodiment such as FIG. 2, will be apparent to those skilled in the art. For example, a polarization rotation element such as waveplate disclosed in U.S. Pat. No. 7,423,731 can be used to adjust the incident polarization. The teaching of U.S. Pat. No. 7,423,731 are incorporated herein by reference.

In this embodiment, the Fourier transforming optical system between the mirror array and the illumination pupil has a front focal point positioned near the mirror array and a rear focal point positioned near the illumination pupil.

In the illustrative example of FIG. 2, when the incident polarization is in the plane of incidence (or perpendicular to it), no change in polarization will occur. However, when the polarization is rotated to 45 degrees, the reflected polarization is further modified by the mirror retardance coatings. If the retardance coating on a given mirror element has half of wave of retardance and the incident polarization is 45 degrees to the plane of incidence, then the reflected polarization will be rotated 90 degrees upon reflection. If half of the mirror elements have the half-wave of retardance, the other half have no retardance, the system can produce two polarization states in equal amounts that can be distributed anywhere in the illumination pupil. The number of available polarizations then depends on the number of unique coatings on the individual mirror elements.

In this embodiment, a lambda/4 plate may be disposed downstream of the Fourier transforming optical system.

Figure 3:
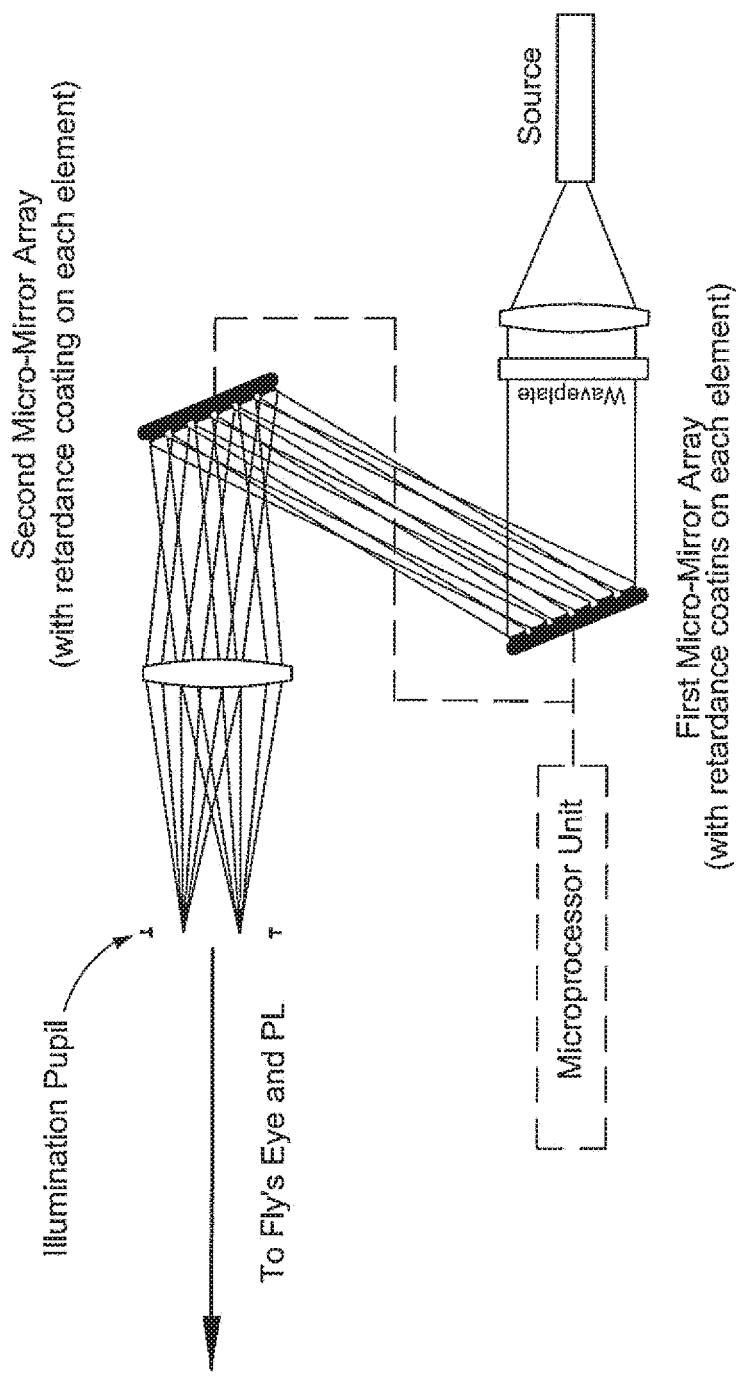
FIG. 3 is a schematic illustration of an embodiment in which polarization control in the illumination system can be implemented with a pair of mirror arrays, according to the present invention.

In addition, it is contemplated that polarization control in the illumination system can be implemented with a pair of mirror arrays, in the manner schematically shown in FIG. 3, where the illumination system is designed to allow for the first minor array to send light to elements in the second mirror array. Where both mirror arrays have thin film coatings with predetermined retardances on each mirror element. In this embodiment, the mirror elements of the first mirror array are steered to direct light to mirror elements in the second mirror array and the mirror elements of the second mirror array direct light to specific locations within the illumination pupil. Furthermore, in this embodiment, the polarization state arriving at the illumination pupil depends on the polarization arriving at the first mirror array (which is optionally controlled through the orientation of a waveplate) the retardance of the coatings on the mirror elements of the first mirror array and the retardance of the coatings on the mirror elements of the second mirror array. One aspect of this embodiment is that the presence of a second set of retarding coatings on the mirror elements of the second mirror array provides additional freedom to select either a wider range of polarizations, or finer control of the polarization. The finer control of polarization arises from the fact that the retardance of the mirror coatings depends on the angle of incidence, and with a second set of mirrors, there is the option of selecting combinations of mirrors in the first and second mirror arrays that provides compensating angles of incidence to reach the desired overall retardance. Also, the waveplate could be made to be segmented with several different retardances in different regions of the beam for even greater flexibility, and different segmented or non-segmented waveplates be changed, in situ, via a turret for example. These segmented waveplates disclosed in U.S. Pat. Application Laid-Open No. 2011/0228247. The teaching of the U.S. Pat. Application Laid-Open No. 2011/0228247 are incorporated herein by reference.

In this embodiment, the Fourier transforming optical system between the second mirror array and the illumination pupil has a front focal point positioned near the second mirror array and a rear focal point positioned near the illumination pupil. In this embodiment, a lambda/4 plate may be disposed downstream of the Fourier transforming optical system.

Figure 4:
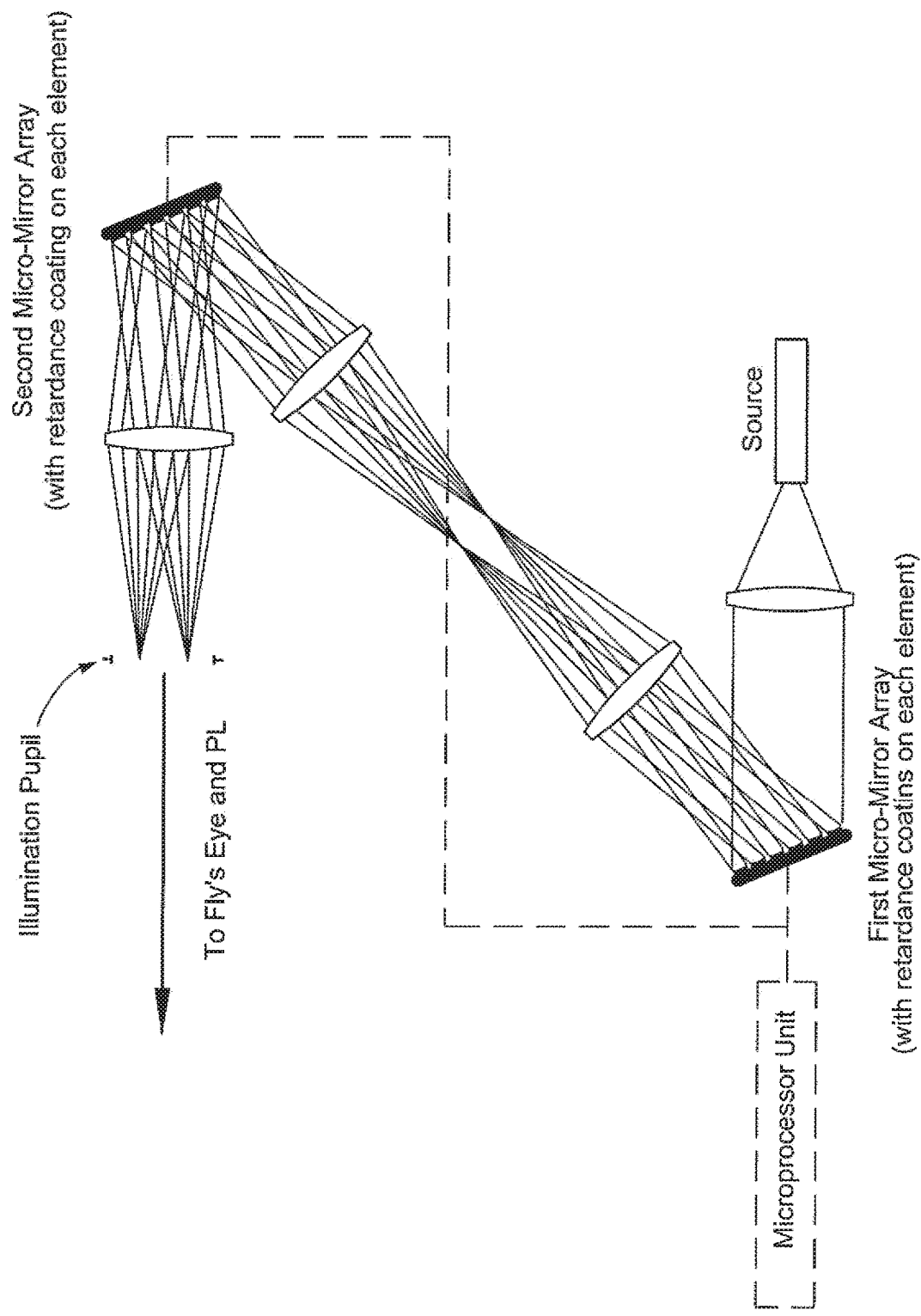
FIGS. 4 and 5 are schematic illustrations of other embodiments in which the present invention can be implemented with two mirror arrays.
Figure 5:
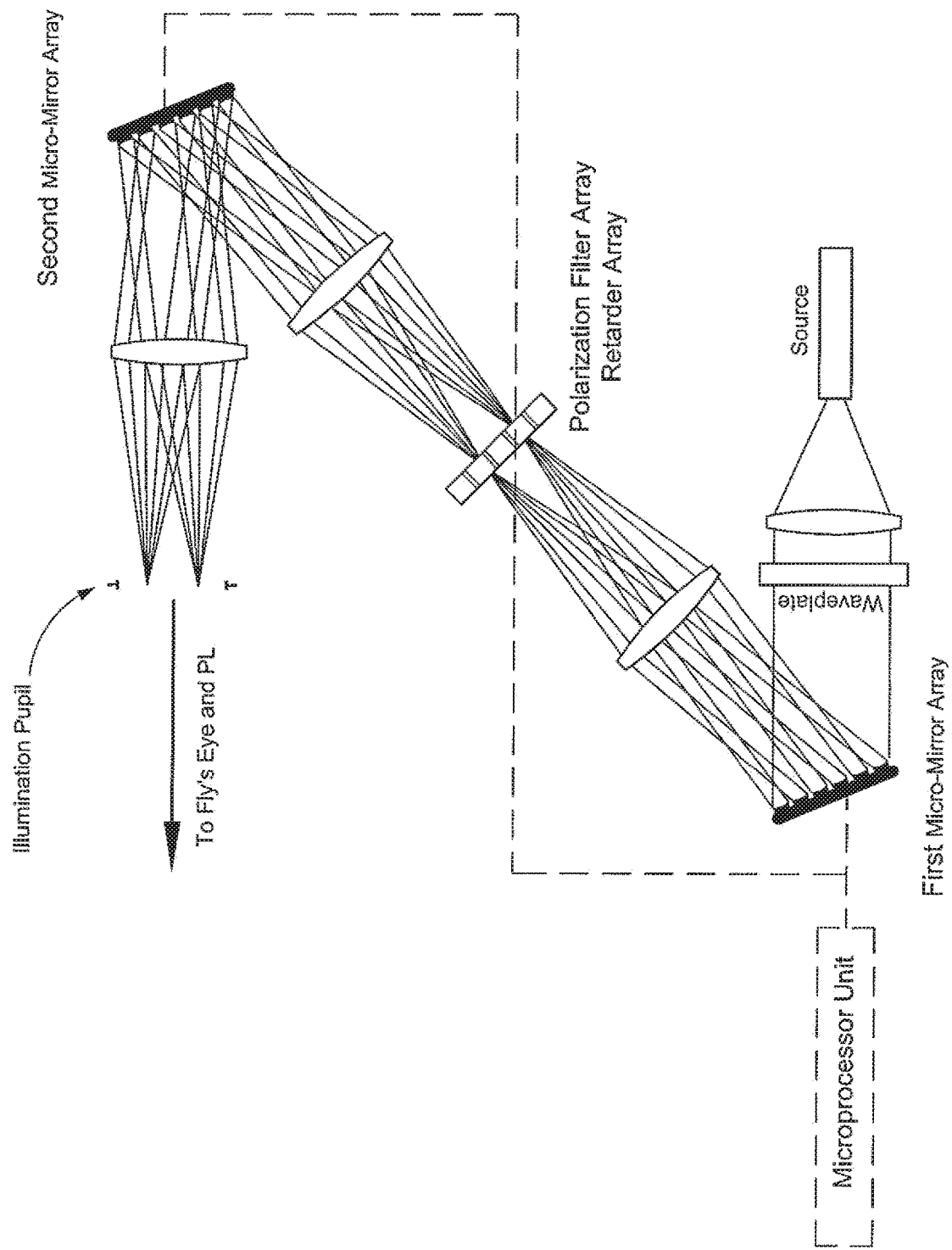

The present invention can also be implemented by the systems shown in FIGS. 4 and 5, where two mirror arrays, each having a set of predetermined retardance coatings on the individual mirror elements, are made conjugate with an intervening relay system, as shown. This implementation is designed to insure that the light leaving a mirror element of the first mirror array will always arrive at a mirror element of the second mirror array. In this configuration (FIG. 4) two mirrors can be used to determine the position of each spot in the illumination pupil, and allow finer control over the polarization. In the implementation of FIG. 5, the polarization control is achieved by directing mirrors of the first mirror array to an array of polarization filters or retarders in the far-field of the lens following the first mirror array. Then the second mirror array, which is nominally conjugate to the first by virtue of a second lens following the filter array, is used to produce the desired distribution of polarization in the illumination pupil.

Although FIG. 5 may seem to indicate that the two mirror arrays have the same number of mirror elements, this is not necessary. It may be advantageous to use many fewer mirror elements in the first array, reducing the complexity of the control hardware and algorithms. In this case, a group of mirror elements in the second mirror arrays are conjugate to a single mirror element in the first mirror array. That group of mirror elements then has a single polarization, depending on which polarization filter is selected by the single mirror element in the first mirror array.

In this embodiment, the relay system has a first (front) optical group and a second (rear) optical group. The array of polarization filters or retarders disposed in the relay system, typically disposed between the front and rear optical group. A front focal point of the front optical group may be positioned near the first mirror array, a rear focal point of the front optical group may be positioned near the array of polarization filters or retarders, a front focal point of the rear optical group may be positioned near the array of polarization filters or retarders, and a rear focal point of the front optical group may be positioned near the second mirror array.

Figure 6:
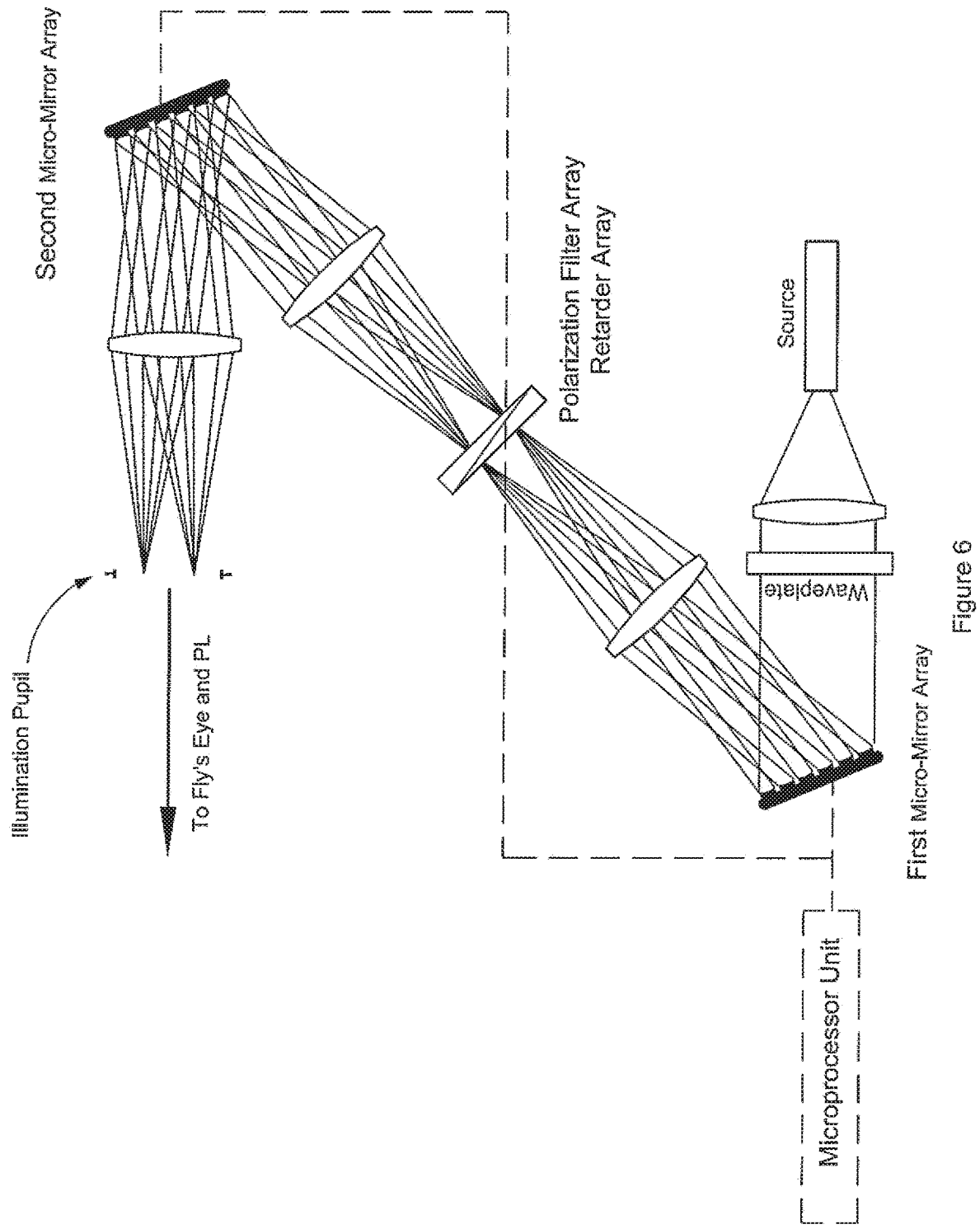
FIG. 6 is a schematic illustration of another embodiment, according to the invention, where a polarization filter array is replaced by a wedge of optically active material.

In another embodiment, shown in FIG. 6, the polarization filter array could be replaced by a wedge of optically active material, e.g., quartz crystal. In this way, the orientation of linear polarization leaving the wedge depends continuously on the position of the beam in the wedge.

In these embodiments shown in the FIGS. 4, 5, and 6, the Fourier transforming optical system between the second mirror array and the illumination pupil has a front focal point positioned near the second mirror array and a rear focal point positioned near the illumination pupil. In this embodiment, a lambda/4 plate may be disposed downstream of the Fourier transforming optical system.

An illumination system according to the present teaching can be readily implemented in a lithographic optical imaging system at the time the optical imaging system is constructed. Moreover, because it is integrated into the mirror array, an illumination system according to the present invention can be provided as an upgrade to an existing lithographic optical imaging system, without taking up any more space in the system.

Thus, the foregoing description provides an illumination device for source mask optimization of the polarization distribution in the illumination pupil of a lithographic optical imaging system, e.g. for a lithograph optical imaging system that uses ArF (Argon Fluoride) radiation source. The illumination device comprises a mirror array located between a radiation source and an illumination pupil, and each mirror element of the mirror array is individually steerable (controllable), and the polarization state of light from each mirror element, or groups of mirror elements, of the mirror array can be selectively controlled, so that the illumination pupil can be filled with a distribution of light that is selectively controlled. The foregoing description shows various ways in which the present invention can be implemented, and from that description it is believed that various other ways in which the present invention can be implemented will be apparent to those in the art.

The invention claimed is:

1. An illumination apparatus configured to illuminate a target surface with light from a light source, the apparatus comprising:
   a first array of mirror elements disposed between the light source and the target surface, wherein each of said mirror elements of the first array is steerable;
   a first optical system between the first array of mirror elements and the target surface, the optical system configured to receive light from the first array of mirror elements;
   a first plurality of polarization elements disposed in an illumination path between the light source and the optical system, wherein each of polarization elements from said first plurality of polarization elements is configured to change a polarization state of the light upon interaction therewith;
   and
   a second plurality of polarization elements disposed in the illumination path between the first plurality of polarization elements and the target surface;
   wherein said first plurality of polarization elements includes a polarization member positioned at a side of the first array of mirrors that faces the light source such that light incident onto the first array of mirror elements from the light source traverses the polarization member, to set polarization of the light incident onto the first array of mirror elements and to make polarization of the light reflected from the first array of mirror elements controllably changeable.

2. An apparatus according to claim 1, further comprising: a controller configured to control orientation of a polarization element from said first plurality of polarization elements.

3. An apparatus according claim 1, further comprising a second array of mirror elements, said second array positioned to directly receive the light reflected from the first array of mirror elements without interaction with an optical component between the first and second arrays of mirror elements, mirror elements from said second array of mirror elements configured to redirect said light to the target surface through the first optical system; mirror elements from said second array of mirror elements configured to carry thereon respectively-corresponding polarization element from the second plurality of polarization elements.

4. An apparatus according to claim 3, wherein mirror elements from the second array of mirror of mirror elements are individually steerable.

5. An a apparatus according claim 1, further comprising a second array of mirror elements positioned to receive the light that has reflected from the first array of mirror elements and interacted with a second optical system disposed between the first and second mirror arrays of mirror elements and to redirect said light through the first optical system to the target surface, mirror elements from said second array of mirror elements configured to carry thereon respectively-corresponding polarization elements from the second plurality of polarization elements.

6. An apparatus according to claim 5, wherein the second optical system includes an optical relay system, and the first and second arrays of mirror elements are optically-conjugate to one another through said optical relay system.

7. An apparatus according to claim 5, wherein a first number of mirror elements in the first array of mirror elements is smaller than a second number of mirror elements in the second array of mirror elements, and wherein a plurality of mirror elements of the second array of mirror elements is optically-conjugate to one mirror element of the first mirror array of mirror elements.

8. An apparatus according to claim 5, wherein the second optical system includes first and second optical groups having first and second focal lengths, respectively, and wherein the first array of mirror elements is positioned at a first focal point of the first optical group while a first focal point of the second optical groups is positioned at the second array of mirror elements.

9. An apparatus according to claim 8, further comprising a quarter-wave plate positioned across the illumination path of said light between the second optical system and the first optical system.

10. An apparatus according to claim 5, further comprising an auxiliary array of polarization filters disposed at a second focal point of the first optical group and at a second focal point of the second optical group to vary the polarization state of said light that has transmitted through the second plurality of polarization elements depending on a location of interaction of said light with said second plurality.

11. An apparatus according to claim 1, further comprising a second array of mirror elements positioned to receive the light that has reflected from the first array of mirror elements and interacted with a second optical system disposed between the first and second arrays of mirror elements and to redirect said light through the first optical system to the target surface,
   wherein mirror elements from said second array of mirror elements carry thereon respectively-corresponding polarization elements from the second plurality,
   wherein the second optical system includes first and second lens systems disposed to have their focal points coincide and wherein an optical wedge element is positioned at said focal points to vary the polarization state of said light that has transmitted through the optical wedge element depending on a location of interaction of said light with said optical wedge element.

12. An apparatus according to claim 11, further comprising a quarter-wave plate disposed across the illumination path of said light between the first and second optical systems.

13. An illumination apparatus configured to illuminate a target surface with light from a light source, the apparatus comprising:

a first array of mirror elements disposed between the light source and the target surface, wherein each of said mirror elements of the first array is individually steerable;

a second array of the mirror element disposed between the light source and the target surface, wherein each of said mirror elements of the second array is individually steerable;

an optical system having first and second lenses positioned between the first and second arrays of mirror elements to cause said first and second arrays be optically-conjugate to one another in the light transmitted by the first array from the light source through the optical system to the second array; and an optical polarizer unit disposed at a first focal point of the first lens and a second focal point of the second lens to vary a polarization state of said light that has transmitted through the optical polarizer unit depending on a location of interaction of said light with said optical polarizer unit.

14. An apparatus according to claim 13, wherein said optical polarizer unit includes an array including multiple polarization filters.

15. An apparatus according to claim 13, wherein said optical polarizer unit includes an optical wedge element.

16. An apparatus according to claim 13, wherein mirror elements of each of the first and second arrays of mirror elements carry thereon corresponding polarization elements configured to change the polarization state of the light upon interaction therewith.

17. An apparatus according to claim 16, wherein said polarization elements include light retardation coatings.

18. An apparatus according to claim 13, further comprising a waveplate between at least one of (i) the first array of mirror elements and the light source and (ii) between the optical system and the target surface.

19. An apparatus according to claim 18, wherein, when the waveplate is located between the optical system and the target surface, said waveplate is a quarter-wave plate.

* * * * *